(12) United States Patent
Dell et al.

(10) Patent No.: US 7,996,747 B2
(45) Date of Patent: Aug. 9, 2011

(54) FORWARD ERROR CORRECTION ENCODING FOR MULTIPLE LINK TRANSMISSION COMPATIBLE WITH 64B/66B SCRAMBLING

(75) Inventors: Timothy Dell, Colchester, VT (US); Rene Glaise, Nice (FR)

(73) Assignee: International Business Machines Corporation, Armonk, NY (US)

( * ) Notice: Subject to any disclaimer, the term of this patent is extended or adjusted under 35 U.S.C. 154(b) by 1199 days.

(21) Appl. No.: 11/556,240

(22) Filed: Nov. 3, 2006

(65) Prior Publication Data

US 2008/0109707 A1 May 8, 2008

(51) Int. Cl.
    *H03M 13/00* (2006.01)
(52) U.S. Cl. .......................... 714/776; 714/786; 714/803
(58) Field of Classification Search .................. 714/776, 714/764, 786, 793, 808
    See application file for complete search history.

(56) References Cited

U.S. PATENT DOCUMENTS

| | | | |
|---|---|---|---|
| 5,923,680 A | 7/1999 | Brueckheimer et al. | |
| 6,349,138 B1 * | 2/2002 | Doshi et al. ................. | 380/200 |
| 6,487,686 B1 | 11/2002 | Yamazaki et al. | |
| 6,715,124 B1 * | 3/2004 | Betts ............................ | 714/792 |
| 6,738,935 B1 | 5/2004 | Kimmit | |
| 6,975,694 B1 * | 12/2005 | Betts ............................ | 375/360 |
| 7,570,643 B2 * | 8/2009 | Prasad et al. ................. | 370/392 |
| 2001/0053225 A1 | 12/2001 | Ohira et al. | |
| 2004/0193997 A1 | 9/2004 | Gallezot et al. | |
| 2006/0212780 A1 | 9/2006 | Ohira et al. | |

FOREIGN PATENT DOCUMENTS

WO 0161909 8/2001

OTHER PUBLICATIONS

Bijan Raahemi—"Error Correction on 64/66 Bit Encoded Links." 0-7803-8886-0/05 IEEECCECE/CCGEL Article published May 2005. (p. 412-416) Saskatoon, Canada.
ISR, Apr. 7, 2008.
OIF Optical Internetworking Forum: "Common Electrical I/O—Protocol (CEI-P) Implementation Agreement" (Doc. No. 1A# CEI-P-01. 0) Internet Citation. [Online] Mar. 2005, XP009097900. Retrieved from the internet: URL:http//www.oiforum.com/public/documents/CEI_P-01.0.pdf> [Retrieved on Mar. 19, 2008] pp. 12-14,23,24,29.
ISR, International Search Report, Apr. 24, 2008.

* cited by examiner

*Primary Examiner* — Fritz Alphonse
(74) *Attorney, Agent, or Firm* — Michael J. LeStrange

(57) ABSTRACT

A Forward Error Correction (FEC) code compatible with the self-synchronized scrambler used by the 64B/66B encoding standard for transmission on Serializer/Deserializer (SerDes) communications channel links. The FEC code allows encoding and decoding to occur before and after scrambling, respectively, so as to preserve the properties of the scrambling operation on the transmitted signal. The code allows the correction of any single transmission error in spite of the multiplication by three of all transmission errors due to the 64B/66B scrambling process. A Hamming code is combined with a Bit Interleaved Parity code of degree n (BIP-n). These two codes provide for protection both for an error anywhere in the maximum length of the packet as well as for an error replicated two or three times by the descrambling process. All single bit errors, whether multiplied or not, have unique syndromes and are therefore easily correctable. In addition, the packet can be transported across multiple serial links for higher bandwidth applications without a degradation of the code efficiency. The Hamming code can be generated from any irreducible polynomial, such as $H(x)=x^{10}+x^3+1$. The BIP code is chosen to be of degree 6 to fit with 64B/66B scrambling polynomial and is represented by $B(x)=x^6+1$.

38 Claims, 7 Drawing Sheets

US 7,996,747 B2

FORWARD ERROR CORRECTION ENCODING FOR MULTIPLE LINK TRANSMISSION COMPATIBLE WITH 64B/66B SCRAMBLING

FIELD OF THE INVENTION

The field of the invention is related to high speed digital communication systems, and more particularly to improved encoding techniques to enhance reliability of transmitted signals by correcting multiplication of single bit errors caused by bit error spreading due to self-synchronized scrambling.

BACKGROUND OF THE INVENTION

In digital communications systems, the transmission of data is subject to corruption and errors due to the presence of noise in the communication channel. Scrambling, used to facilitate accurate reception of the signal at the destination, introduces additional errors through a process known as error spreading. In such systems, it is common to encode the transmitted signal at the source using redundant parity bits to allow correction of the errors. A digital bit stream is typically parsed into fixed length datawords of n bits based on a maximum length for which the system receiver can extract a clock signal timing reference from the transmitted data. With the concatenation of redundant bits the encoded digital word of m bits is longer than the original dataword.

One of the challenges in providing error correction for high-speed links is that any error correcting checkbits appended to the dataword being protected also need to be considered for their effect on the bit transition density of the physical layer. Typically, in order to maintain synchronization with the proper position within a packet boundary to strobe data, a minimum number of transitions from 0=>1 or from 1=>0 must be observed. A long stream of 0's, for example, may cause a receiver to lose track of when to sample the incoming data. Thus when a 1 is ultimately transmitted, the receiver may have lost synchronization and fail to detect the 0=>1 transition.

In order to prevent loss of synchronization, an encoded dataword may be processed by one of several known scrambling techniques. A self-synchronized scrambler is often implemented with a Linear Feedback Shift Register (LFSR) that is programmed to multiply the dataword according to a predefined polynomial to cause a mathematically guaranteed minimum number of bit transitions. The scrambler LFSR can also be preset to a specific value to further enhance the number of bit transitions for an all-zero data payload. On the receiving side, the payload must be descrambled, usually by a similar inverse process, where the bitstream is divided by the same predefined polynomial.

Data scrambling is used to maintain clock synchronization between the transmitter and receiver. For the reasons stated above, data scrambling algorithms usually limit the maximum number of sequentially transmitted ones or zeros, such that a minimum number of logic transitions may be recognized for successful extraction of the transmitted clock. Limiting the maximum number of bits having the same value enables the receiver to maintain synchronization with the source.

Although scrambling is helpful in reducing receiver drift, it provides an additional source of transmission errors because single bit errors occurring in the original data stream are multiplied through the scrambling process. The multiplication of a single bit error occurs because the scrambling and descrambling functions rely on each bit of a dataword, including a bit that is in error when reconstructing the original transmitted data. The multiplication of single bit errors in this fashion is known as "bit error spreading" and occurs at the receiver when a descrambler attempts to restore the scrambled signal to its original state.

In order to insure that all of the bitstream is properly scrambled, any error correcting code (ECC) checkbits appended to the dataword must also be scrambled. This necessitates that scrambling be done after the ECC checkbits are added to the transmitted word. The transmitted dataword is likewise descrambled at the receiver prior to activating whatever ECC scheme is implemented in the receiver. In this manner, the bit transmission density is maintained for the entire packet, and not just the databit portion of the packet.

An exemplar prior art communications system is shown in FIG. 1, wherein (Physical Coding Sublayer) upper interface 100 represents a 10 gigabit media independent interface (XG-MII) that provides an interface for data communications equipment irrespective of the physical mode of transport of data to be forwarded 102 or received 104. The encoder 142 and gear box 146 functions are necessary to map data and control character to the blocks and to adapt formats. They are not necessary to the understanding of the invention and are not further described. Receive path 150 includes the descrambler 154 to recover the original stream of bits. PCS 120 also includes a function 160 to monitor bit error rate over the transmission medium and there is a decode function 152 which is the counterpart of the transmit encoder 142. Data from a logical interface 100 is sent to the physical coding sublayer 120, where first it is encoded with an appropriate ECC and then scrambled. Finally, if necessary, the speed of the logic circuits performing the encoding and scrambling is matched to the transmission speed of the actual physical medium 115 by gearbox 146. In the case of the 64B/66B code, as the name suggests, two bits are added by the gearbox for every 64 bits to be transmitted. The two extra bits, used to frame the 64-bit packets, are removed at reception and are not included in the scrambling and correction processing steps. The data is then sent across the interface medium as a packet containing the original dataword plus the encoded checkbits, all of which have been scrambled to provide the required bit transition density.

Those skilled in the art will realize that although the invention is described in the particular context of 10GbE it could be practiced as well in a different environment and will know, from the detailed description infra, how to adapt it to other applications especially, for applications where a different scrambling polynomial would be used.

During the physical transmission of the payload, random, single-bit errors are common. This is due to the extremely high speeds employed in communications channels used today. If there were only one error in the data packet, then a simple Hamming ECC would be able to correct all such errors. Because self-synchronized scramblers multiply errors, a more robust solution is required at the receiver to handle the incident error and any replicated errors.

On the receiving end, which could be in the same logic chip or on a completely different logic chip, the received packet is first synchronized and the packet boundaries detected. The invention does not assume any particular method for delineating packet boundaries. Often, when fixed size packets are transmitted, packet boundaries are detected on the basis of the added redundant bits and encoding of the data stream. Then, in order to keep the bit error rate (BER) as low as possible, the packet is received using a predefined bit transition density derived from the scrambling step. The received packet is descrambled and then decoded to allow for the correction of any errors in the bit stream.

However, as mentioned above, the descrambling process has the undesirable effect of causing any single-bit errors that were introduced in the channel during transmission to be replicated according to the number of terms and degree of the scrambling polynomial. A single bit error can simply be propagated across the channel, or it may be replicated multiple times depending on the form of the scrambling polynomial. Whether the error remains a single-bit error or is replicated multiple times depends on where in the transmitted payload sequence it occurs. If the error occurs at the beginning of the sequence, then it will be spread as a result of the LFSR and will usually be replicated within the same data packet, provided the highest order of the polynomial is less than the total number of bits in the transmitted sequence. If the initial error occurs towards the end of the payload, it will still be spread, however, only the first occurrence may fall in the current packet, leading to only a single bit error. Nonetheless, the replicated manifestations of the error will then fall into the next data packet and cause a double-bit error there. Incident errors in the middle of the word can be spread into various double-bit errors, according to the scrambling polynomial and the position of the incident error.

Another aspect of digital communications related to bit transition density or maximum run length is cumulative DC offset, which reflects the sum of the low frequency voltage components of the transmitted data stream experienced at the receiver. In binary systems, discrete logic values for zero and one are typically assigned opposite polarity voltages. As a result, without periodic adjustment, the cumulative DC offset experienced at the receiver can migrate toward the positive or negative power supply limit, which may lead to an overload condition at the receiver. The cumulative DC imbalance can be expressed as the number of bit values required to be inverted to produce a balanced bit stream. If the cumulative DC offset experienced at the receiver can be effectively balanced, the DC voltage swing experienced at the receiver can be reduced. In this regard, a balanced DC offset can be exploited to reduce overall signal to noise ratio (SNR) at the receiver because low frequency noise may be more effectively filtered out. This is accomplished by ensuring the encoded data stream represents a balanced distribution of logic zero and one values over a fixed unit of data bits.

Forward error correction (FEC) is a technique designed to identify and correct errors occurring in the course of transmission that obviates the step of resending the data by the transmitter when errors occur. FEC is implemented by applying an algorithm to a digital data stream to generate redundant bits that are transmitted with the original data. An identical algorithm is performed at the receiver end of the system to compare the transmitted calculation of the encoded data with the received encoding. The result of the comparison is known as the FEC syndrome. A null syndrome is indicative of a received error-free data stream. A non-zero entry in any bit position of the error syndrome must be interpreted to correct one or more errors.

The problem of bit error spreading is compounded further with the presence of FEC at the receiver because the total number of errors in the descrambled data stream may exceed the capability of the FEC decoder. If the error detection and correction capability of the system is exceeded, the original data is corrupted and unrecoverable, and must be retransmitted, thereby impacting overall system performance.

Another factor affecting the correction of scrambled data across a high-speed communications link is the practice of running multiple serial links in a parallel structure. It is becoming more and more common, in order to improve overall system bandwidth, to aggregate multiple links to transmit a packet of data simultaneously over several links or bitlanes. In this manner, the same data payload can be delivered in N/b fraction of the time used for the delivery of a payload over a single link, where N is the time required to transmit one data payload or packet across a single link, and b is the number of links. It is further readily seen that the length of the subdivided packet is also N/b. In theory, N/b could be a fractional number, but in practice, the number of links is chosen in consideration of the packet size (including payload, header and redundant bits), so it is assumed for this example that b divides N evenly, and therefore each sub-packet will contain the same or similar number of bits. In this case, in order to maintain proper bit transition density across each physical link, which is required to achieve a low transmission BER, the dataword is split into b sub-datawords, and each sub-dataword is scrambled and descrambled independently. On the receive side, the descrambled sub-datawords are reconstructed to form the original dataword, which is then decoded for possible error correction.

Certain proposals have been made to provide an ECC compatible with the bit error spreading of a scrambler, such as commonly assigned United States Patent Application US20040193997A1, entitled: "Forward Error Correction Scheme Compatible with the Bit Error Spreading of a Scrambler," which is incorporated herein by reference. A drawback of such a scheme is that it is not able to correct errors when the packets are transmitted across multiple bitlanes, as mentioned above.

Other applications of FEC codes fail to fully account for the effects of bit error spreading attributable to the descrambling process. For example, a Network Processing Forum paper submitted by Xilinx (NPF 2003.320.00) discloses a 64B/66B encoder that fails to address the bit error multiplication problem caused by descrambling. Another approach has been taken by the Optical Internetworking Forum in document OIF2004.229.03, submitted by PMC-Sierra, Xilinx, and Sandia National Laboratories, which also fails to address the multiplication problem. Similarly, commonly assigned U.S. Patent Application 2004/0193997 A1 discloses a method for combining a simple FEC code with scrambling and descrambling functions to reduce bit error spreading, but requires transmission of data packets over a single serial link and therefore propagates bit error information over multiple packets. Accordingly, a need exists for a FEC code compatible with 64B/66B scrambling format that may be implemented over a multi-channel communication system while preserving channel bandwidth efficiency.

SUMMARY OF THE INVENTION

A Forward Error Correction (FEC) code compatible with the scrambler used by the 64B/66B encoding standard is disclosed for transmission on Serializer/Deserializer (SerDes) communication links. The 64B/66B standard enables lower overhead in terms of the number of error correction or parity bits required (2/64 or 3%) as compared to 8B/10B standard encoding (2/8 or 25%). The proposed FEC allows encoding and decoding to occur before and after scrambling, respectively, such that the results of the scrambling operation on the transmitted signal are preserved. The code allows the correction of any single transmission error in spite of the multiplication by three of all transmission errors due to the 64B/66B scrambling process.

According to a first embodiment, a Hamming code is combined with a Bit Interleaved Parity code of degree n (BIP-n). The Hamming code can be generated from any irreducible polynomial, such as $H(x)=X^{10}+X^3+1$. A sixth degree polynomial is chosen for the BIP code and is represented by $B(x)=X^6+1$. The degree of the BIP code is chosen to fit with the error spreading pattern of the scrambler so that a unique FEC syndrome can always be obtained. These two codes together provide for protection both for an error anywhere in the maximum length of the packet as well as for an error that is multiplied, that is, replicated two or three times by the descrambling process. The propagation of bit errors due to spreading is characterized by predictable patterns or syndromes. All single bit errors, whether multiplied or not, have unique syndromes and are therefore easily correctable by the proposed FEC code. In addition, the packet can be transported across several serial links, which is desirable for higher bandwidth applications without degrading the code efficiency.

DETAILED DESCRIPTION OF THE PREFERRED EMBODIMENTS

In the following detailed description of embodiments, reference is made to the accompanying drawings which form a part hereof, and in which are shown by way of illustration specific embodiments that are described in sufficient detail to enable those skilled in the art to practice the invention, and it is to be understood that other embodiments may be utilized and logical, structural, electrical and other changes may be made without departing from the scope of the present invention.

According to a first embodiment a FEC code is disclosed that is compatible with the scrambler used by the 64B/66B encoding for transmission on SerDes channel links with a lower overhead (2/64 or 3%) than 8B/10B encoding (2/8 or 25%). The FEC code according to a first embodiment requires encoding and decoding to occur before scrambling and after descrambling, respectively, so as to preserve the properties of the scrambling operation on the transmitted signal. The proposed code allows the correction of any single transmission error in spite of the multiplication by three of all transmission errors resulting from the 64B/66B descrambling process.

Figure 1:
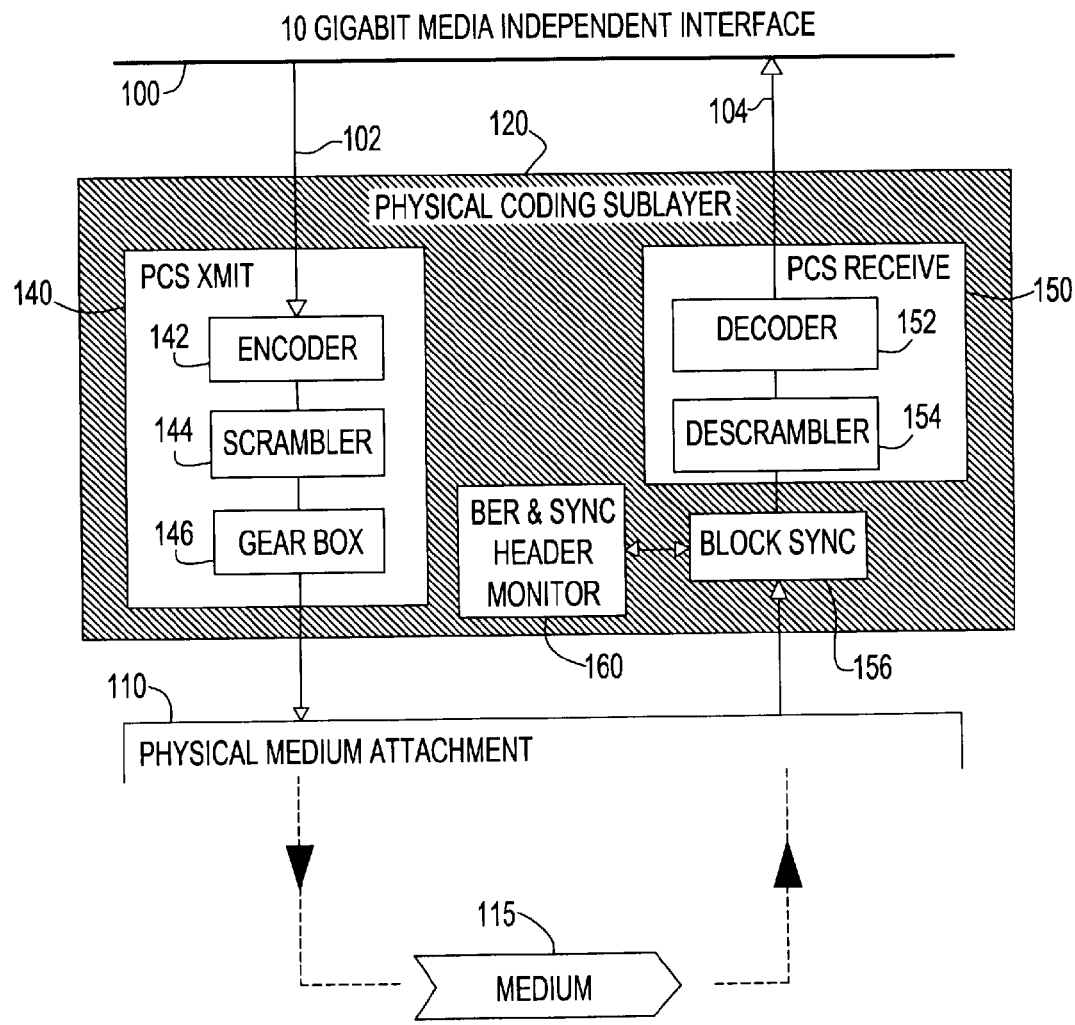
FIG. 1 schematically illustrates a 10GbE media independent physical interface.
Figure 2:
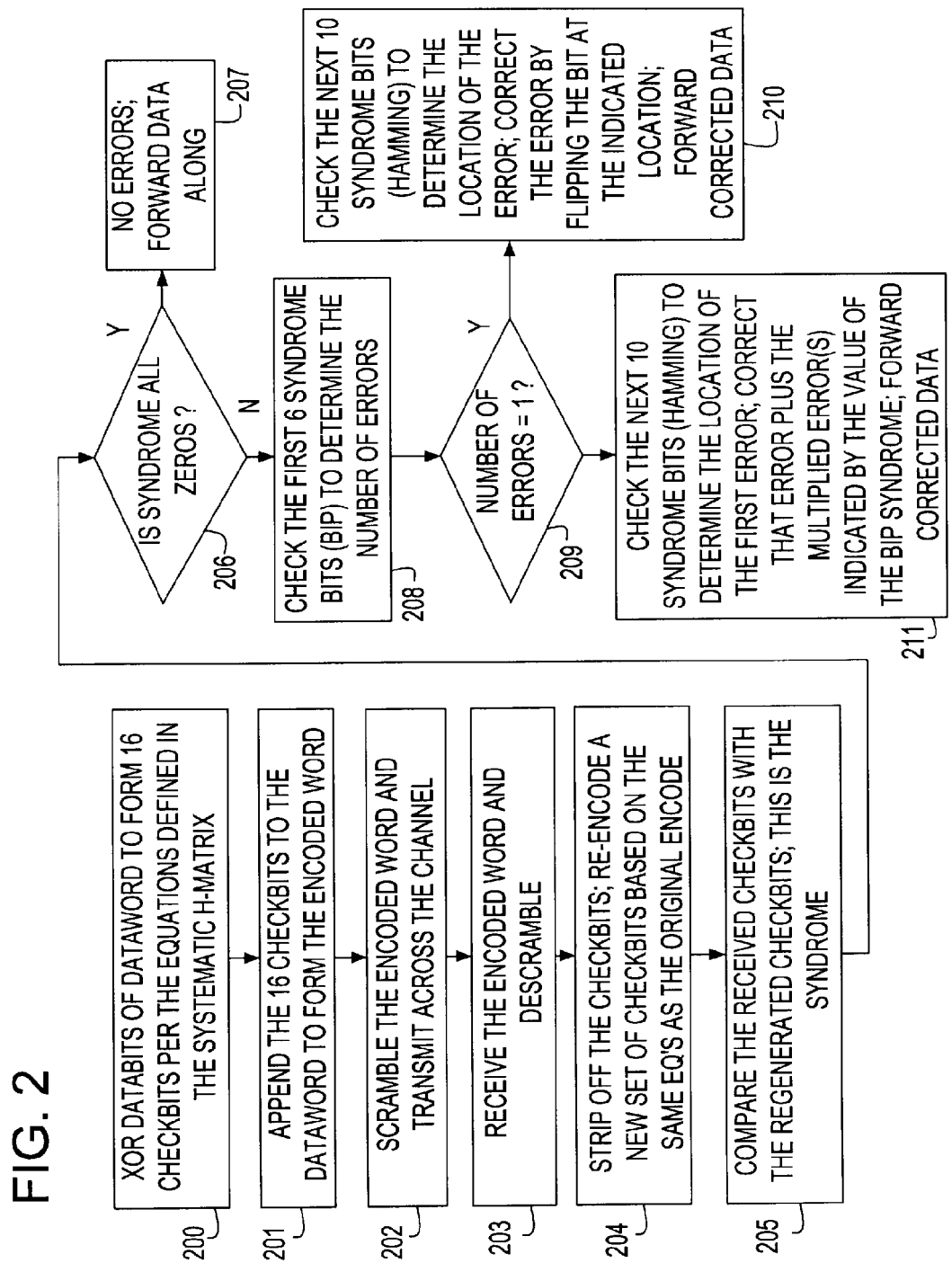
FIG. 2 depicts a flow chart of the encoding and decoding algorithm according to a first embodiment.

FIG. 2 depicts the encoding and decoding processing flow according to a first embodiment. A logical XOR is performed on the dataword to be transmitted to form a 16 bit ECC checkbit sequence 200 in accordance with the equations defined in a systematic H-matrix. The checkbits are appended to the data word to form the encoded dataword 201, which is input to the scrambler. The scrambled dataword is then transmitted across the channel 202 and descrambled at the destination 203. The checkbits are separated from the dataword and stored locally 204. A new set of checkbits is generated from the transmitted dataword and a compare is performed with the transmitted checkbits 205. The result of the compare step is an error syndrome from which the number and location of errors is determined. The first six bits of the syndrome correspond to the BIP-n portion of the encoding process and reveal the number of errors present in the transmitted dataword 208. The remaining ten bits of the error syndrome will indicate the location of one or more errors to be corrected 811.

Figure 3:
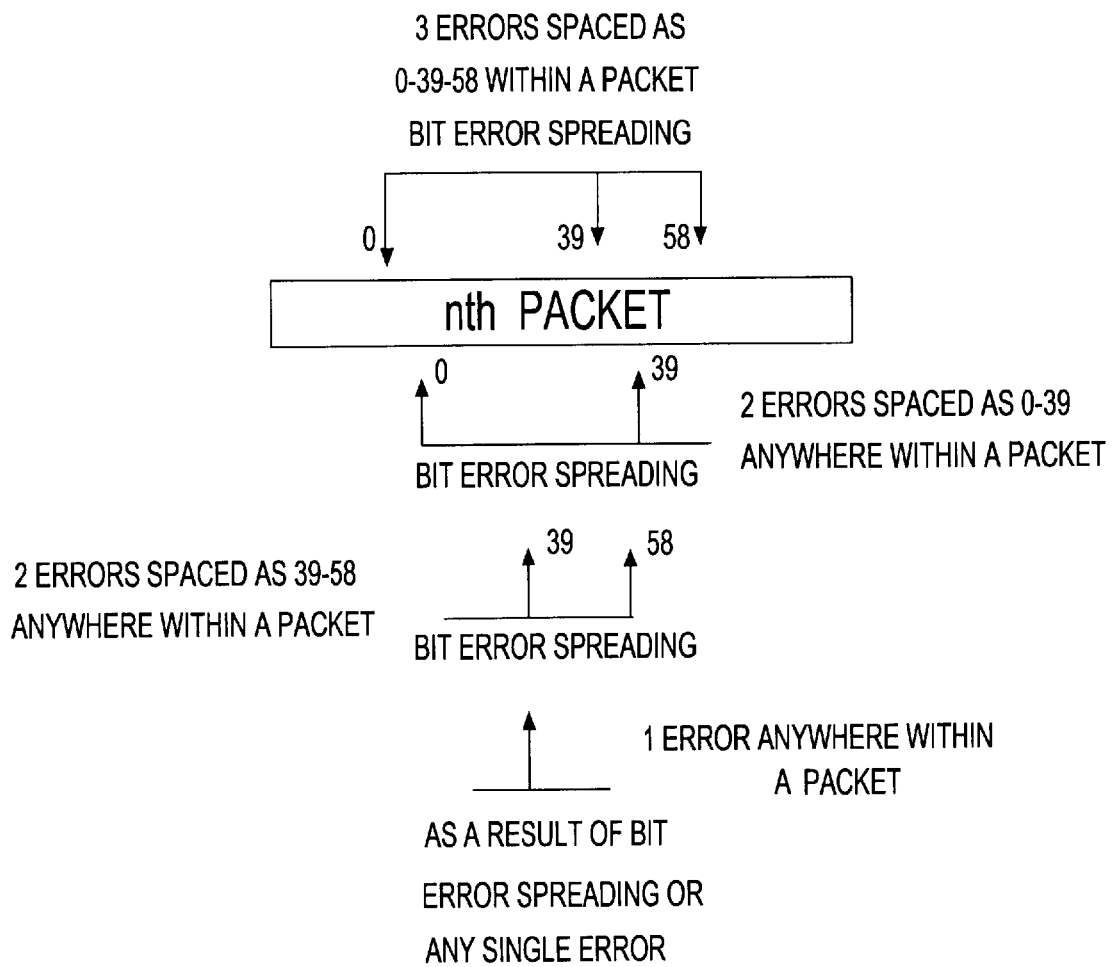
FIG. 3 schematically illustrates the concept of bit error spreading caused by a descrambling operation on a single data packet.

Referring to FIG. 3, various error spreading syndromes are illustrated for an individual packet in accordance with the applied scrambling polynomial utilized in the 64B/66B protocol. For the 64B/66B protocol, the scrambling polynomial is represented as, $G(x)=1+X^{39}+X^{58}$, therefore the scrambling process involves a multiplication by three of the dataword. A single error may occur anywhere within the packet frame, whereas two errors (a single error and one replicated instance) may be spaced at an interval of 0-39 bits anywhere within a packet or an interval of 39-58 bits anywhere within the packet. Three errors in the packet would be spaced at intervals of 0, 39 and 58 bits. The errors therefore span on 59 bits in accordance with the powers of the scrambling polynomial i.e.: 0, 39 and 58. If no assumption is made as to the number of SerDes lanes (or high-speed links) dedicated to transport a flame protected by the FEC code, then a single transmission error on a link may result in the occurrence anywhere in a frame of up to three errors. If three errors are within the same frame they are, however, assumed to be spaced in accordance with the powers of the polynomial: 0-39-58. If two errors are in the same frame they must be spaced within bits 0-39 or bits 39-58 any where in the flame. All these combinations of errors, along with all single errors, have unique syndromes, and are therefore correctable.

Figure 4:
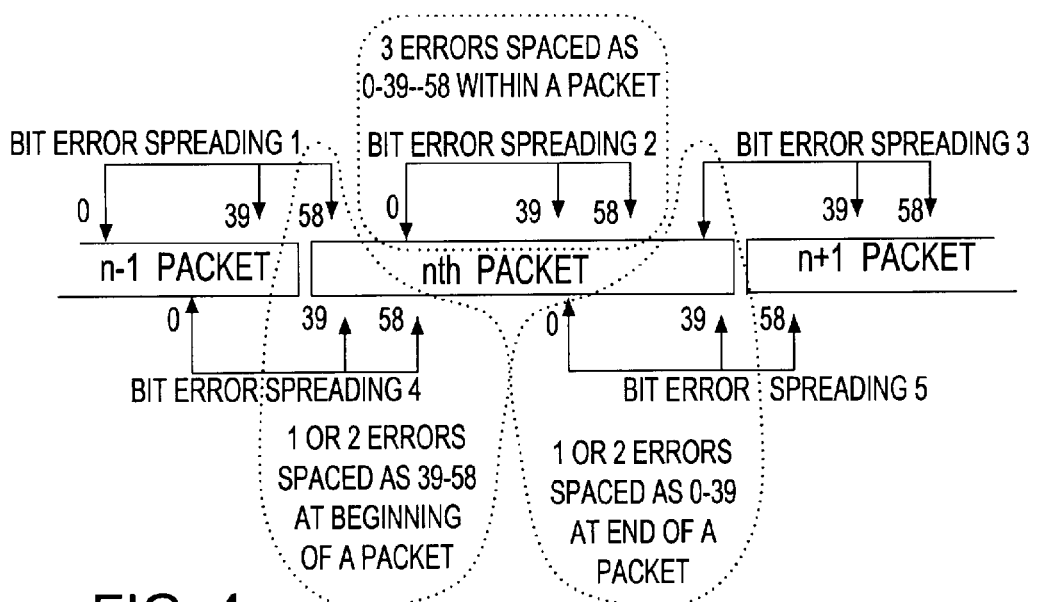
FIG. 4 schematically illustrates the concept of bit error spreading caused by a descrambling operation over multiple data packets on a single channel.

FIG. 4 shows multiple data packets transmitted over a single serial link and illustrates how a single bit error could produce a multi-bit error depending on its bit location in the word. If the single bit error appears early in the $n^{th}$ packet, then the full effect of the scrambling can be seen. If it occurs late in the incident word, then part of the errors would fall outside the word. The error numbers in FIG. 3 refer to the relative bit position within any given packet of the spread errors caused by the scrambling polynomial during the descrambling process.

For example, Bit Error Spreading 1 shows the initial error occurring in the middle of the n−1 packet and is designated by position 0. After processing by the descrambler, the error is also spread to a bit position 39 bits later in the sequence, as well as 58 bit positions later in the sequence. Accordingly, Bit Error Spreading 1 results in the n−1 packet experiencing a double-bit error, while the nth packet experiences a single bit error. However, if the initial error occurs a little later in the bitstream, as shown in Bit Error Spreading 4, only the initial error will be observed in the n−1 packet, and the $n^{th}$ packet will experience a double-bit error.

Bit Error Spreading 2 shows an initial error occurring towards the beginning of the nth packet, and the resulting spread errors also fall within the $n^{th}$ packet, leading to a triple-bit error.

Bit Error Spreading 3 is similar to Bit Error Spreading 4, but with the initial error occurring in the $n^{th}$ packet, and the resulting spread errors causing either a single or double-bit error in the n+1 packet, in addition to the single or double-bit errors in the $n^{th}$ packet.

Thus is can be seen that while a single error correcting (SEC) Hamming code would be sufficient to correct a random single-bit error, it would not be able to correct either the double-bit error or the triple-bit error which are caused by the scrambling algorithm and shown in all three cases of FIG. 4.

Figure 5:
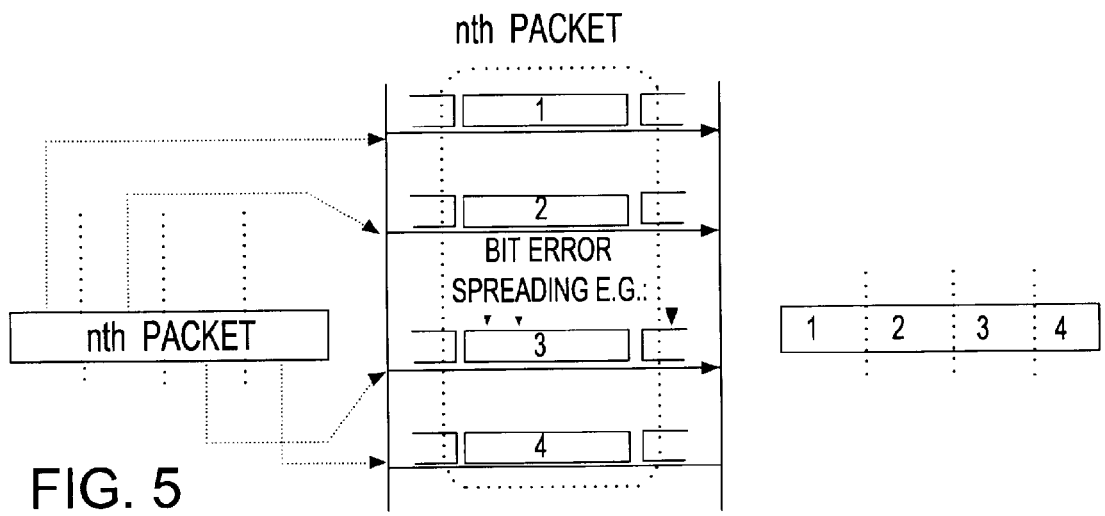
FIG. 5 schematically illustrates multiple errors transmitted over a single link in a multi-link system resulting in an uncorrectable error condition.

In the case of a multiple channel link, FIG. 5 illustrates how a single packet can be decomposed and transported on any number of links and reconstituted at the receiver. Single, double and triple bit errors can occur anywhere in packet and still be corrected because the spacing of replicated errors is a function of the scrambling polynomial. If the BIP-n code exponent is chosen such that there are unique remainders modulo n, then the replicated bit errors can be identified and corrected.

As shown in FIG. 5, the $n^{th}$ packet is decomposed into 4 sub-packets. Each sub-packet is scrambled and descrambled individually. However, now it can be seen that the spread error occurring in sub-packet 3 causes two errors in the $n^{th}$ packet, plus an additional error in the n+1 packet. Unfortunately, ECC information is not propagated across packet boundaries. Accordingly, the multiplication of a single bit error to the n+1 packet in the same bitlane is not detectable with current methods, and therefore the scheme used in US20040193997A1 will not correct multi-bit errors in a system employing multiple serial links.

If packets are transmitted over a sufficient number of links so that each component of the transmitted data packet is smaller than 19 bits, then only single errors would have to be corrected and any single Hamming code implementation would suffice. This is because a replicated error would never fall within the same sub-packet in which the single bit error appeared. For example, in a 64B/66B code, 64-byte frames can be protected with 2 bytes of ECC checkbits. In terms of bit count, this is a total of 64×8=512 bits. Now if the number of links used to transmit the 512 bit encoded word is at least 32, then each subpacket would be a maximum of 16 bits, which is less than the 19 bit minimum spreading distance of the scrambling polynomial. Thus whenever an error occurs, it could never be spread to just one ECC word, and therefore, no more than a single bit error occurs in each of the affected packets. However, this kind of approach is inefficient because of the additional bandwidth required to implement. More often, multiple bitlanes in groups of 4, 8 or 16 are used to improve bandwidth. In general, if N/b<s, then a simple Hamming code is sufficient, where again, N is the total length of the ECC protected frame in bits, b is the number of bitlanes, and s is the minimum spreading distance of the scrambler polynomial.

An ECC scheme is designed to match an error model. Therefore, any error complying with the error model must be correctable. The error model described herein is a single transmission error multiplied by the descrambling process so that replicated errors spaced according to the powers of the scrambling polynomial must be considered. However, the ability of an ECC code to detect additional errors, in this case a double bit error, should be assessed. For example, when two transmission errors occur, up to six errors may be detected after descrambling. Iterative simulation is necessary to assess the level of detection capability of the FEC code. Ideally, the FEC code should achieve a single error correction/double error detection SEC/DED level of robustness, but this may not be realized in practice where a small percentage of double transmission errors are not detected.

The 64B/66B standard defines packets of 64 bits to which two bits are added for delineation. The invention implicitly assumes that protection with an ECC will be carried on larger packets or frames so the redundant bits needed to implement ECC, will stay at a reasonable level. As an exemplary case, frames, including redundant bits, are restricted to an entire multiple of those 64-bit packets. The FEC code described herein need not assume any particular method to delineate an ECC protected frame. The FEC code of a first embodiment can protect a dataword of up to $2^{10}-1=1.023$ bits. Thus, in practice, ECC protected frames (including 16 redundant bits) comprising up to fifteen 64-bit packets, e.g., of the type defined by the 64B/66B standard, may be considered.

A code to realize FEC with robust error detection and correction capability according to a first embodiment is structured as discussed below. The FEC code combines a Hamming code with a Bit Interleaved Parity of degree n (BIP-n) code, which can be generated with the two-term polynomial $X^n+1$. The Hamming code can be generated from any irreducible polynomial, preferably primitive, a list of which can be found, in 'Error-Correcting Codes', Peterson & Weldon, The MIT Press, 1972, which is incorporated herein by reference. Peterson and Weldon illustrate a $10^{th}$ order polynomial in Table C.2 of appendix C, represented as '2011' in octal notation i.e.: $H(x)=X^{10}+X^3+1$. A $6^{th}$ order BIP code is chosen, for reasons explained infra, and corresponds to the following polynomial: $B(x)=X^6+1$.

The degree of the Hamming code determines the length of the code, i.e., the maximum packet or code word size, including the ECC bits that can be protected. A degree-10 primitive polynomial, which generates a maximum length sequence, can span over 1,023 bits. Thus, it can be used to protect a typical 64-byte packet and any length up to 127-byte packets. The degree of the BIP is chosen to ensure uniform error spacing as defined by the scrambling polynomial terms: 0-39, 39-58 (i.e.: 19 bits apart) and 0-58 do not have the same remainders, modulo n. This approach ensures a unique checkbit error syndrome, which is the result of an XOR operation between the originally transmitted dataword and the reconstituted dataword at the destination node. For the 66B/64B standard, the BIP-n code must be at least a sixth order for the chosen scrambler polynomial $G(X)=X^{58}+X^{39}+1$ because as shown in Table 1 below, n=6 is the first modulo that provides different remainders for all powers of the scrambler polynomial terms:

TABLE 1

| |
| --- |
| (0 19 39 58) modulo 3 = (0 1 0 1) |
| (0 19 39 58) modulo 4 = (0 3 3 2) |
| (0 19 39 58) modulo 5 = (0 4 4 3) |
| (0 19 39 58) modulo 6 = (0 1 3 4) |
| (0 19 39 58) modulo 7 = (0 5 4 2) |

Figure 6:
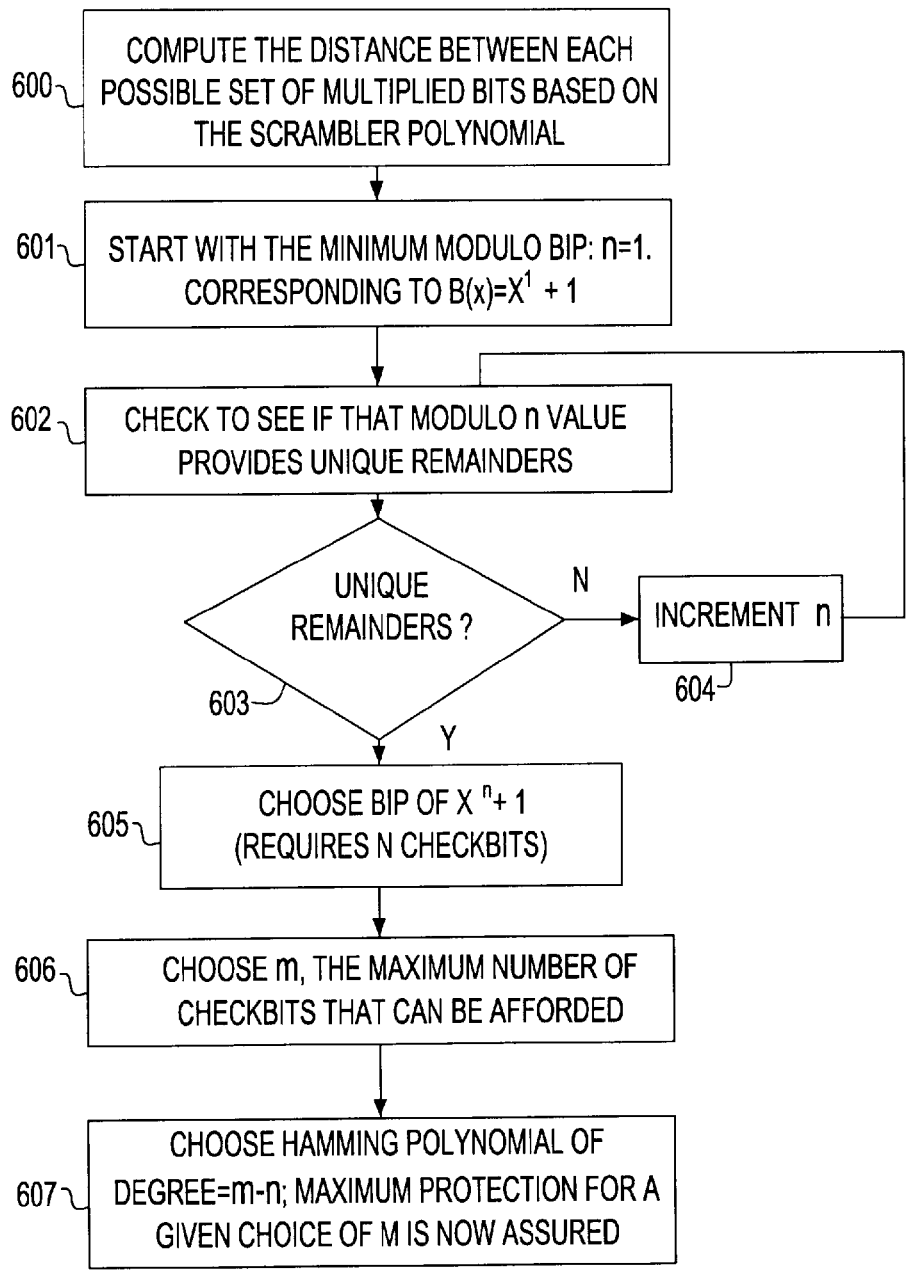
FIG. 6 depicts a flow chart for a method of selecting FEC polynomials according to a first embodiment.

FIG. 6 depicts a flow chart showing an algorithm for selecting the order of the Hamming code and the BIP-n code, such that the most robust solution is realized for the width and number of channels utilized by the system. The distances between each possible set of multiplied bit errors must be determined from the powers of the scrambling polynomial 600, which in the case of the 64B/66B standard corresponds to $G(X)=X^{58}+X^{39}+1$. The minimum power (n) of a bit interleave parity (BIP-n) code must be determined, such that any single transmission error pattern and its replications return a unique modulo n remainder (601-605). For the Hamming code $H(x)=X^{10}+X^3+1$, choosing n=6 for BIP-n results in combinations of errors spaced as: 0-39, 39-58, 0-39-58, with single errors always returning a different pattern for the 6-bit component of the syndrome corresponding to the BIP-6 as shown below in Table 2. Modulo 6 division of the bit distances is the first value of n to provide unique remainders. Based on the total number of bits that may be dedicated to ECC checkbits for a given system configuration, the degree of the Hamming code m is calculated as m−n bits 607. Choosing a BIP-6 polynomial allows the maximum number of checkbits to be dedicated for the second part of the code, which ensures that the highest level of robustness for protection against multibit errors.

BIP-6 syndrome pattern (and any rotation thereof):

TABLE 2

|  | 0 | 1 | 2 | 3 | 4 | 5 |
|---|---|---|---|---|---|---|
| single error | 1 | 0 | 0 | 0 | 0 | 0 |
| 0-19 | 1 | 1 | 0 | 0 | 0 | 0 |
| 0-39 | 1 | 0 | 0 | 1 | 0 | 0 |
| 0-39-58 | 1 | 1 | 0 | 0 | 1 | 0 |

Accordingly, when combined with a BIP-6 code, a simple Hamming code is sufficient to achieve a single error correcting code in spite of the error multiplication introduced by the scrambler anywhere in a frame and potentially transported over several links. In this regard, all error combinations matching the error model have a unique syndrome which is easily decodable and correctable.

Figure 7:
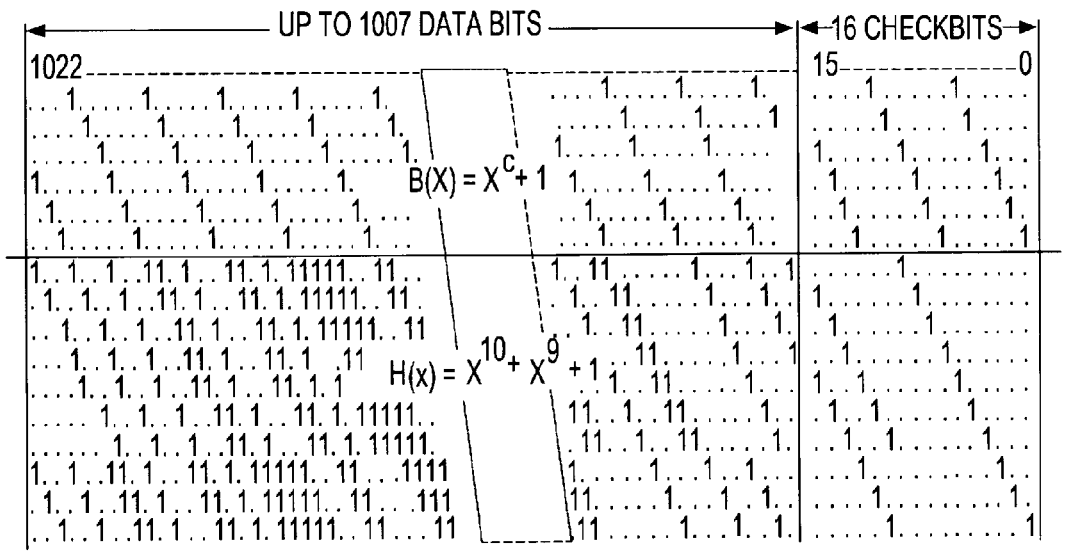
FIG. 7 shows an exemplar H-matrix of a forward error correction code according to a first embodiment using a combination of bit-interleaved parity and Hamming encoding.
Figure 8:
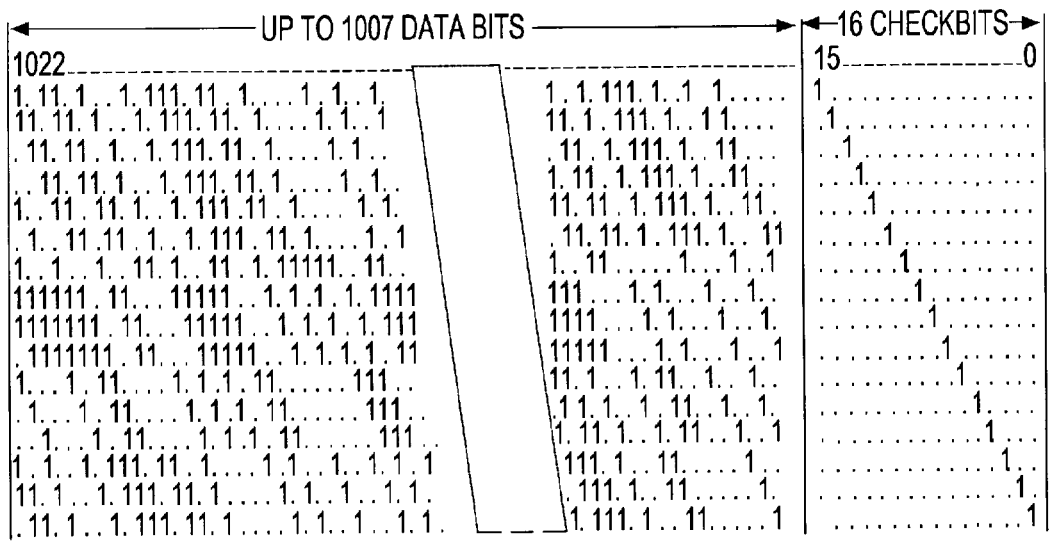
FIG. 8 shows a transposed version of the exemplar H-matrix of FIG. 7 in systematic form.

Referring to FIG. 7, the H-matrix form (1,023 columns, 16 rows) of the (1,023/1,007) code generated from the multiplication of the dataword with H(x) and B(x) according to a first embodiment is shown. However, to allow a straightforward computation of the ECC bits at encoding, the matrix shown in FIG. 5 should preferably be transposed to a systematic form which requires a diagonalization of the checkbit matrix. This can be accomplished using standard mathematical methods. The resulting systematic form matrix derived from FIG. 7 is shown in FIG. 8.

After checking all combinations of single to triple bit errors, spaced as shown in FIGS. 3 and 4, the FEC code provides a robust single error correction code in spite of the multiplication of errors by the scrambler polynomial. In a 1,023-bit packet there are 3,976 combinations of errors, each returning a different syndrome so they all can be unambiguously corrected. The number of unique error syndromes for each class of error are as follows:

| 3-bit error combinations 58-39-0 = | 965 |
|---|---|
| 2-bit error combinations 39-0 = | 984 |
| 2-bit error combinations 58-39 = | 1,004 |
| 1-bit error combinations = | 1,023 |
| Total: | 3,976 |

For a data field shorter than the capacity of the matrix, the FEC code must be depopulated to match the actual application packet size and the discarded bits are not considered. To preserve the property of the matrix the depopulation must occur exhaustively from left to right, down to the size of the packet.

Decoding at the destination node is accomplished subsequent to the descrambling operation. The systematic form of the H-matrix, which has the same properties as the original matrix, should be used to simplify the regeneration of ECC bits. However, this complicates the decoding of the error syndromes since the simple original matrix structure is modified by the diagonalization operation. A more efficient way to proceed is by using the systematic H-matrix both for generating check bits on the encode side and comparing the transmitted check bits and the recalculated checkbits on the receiver end. Prior to decoding the syndrome, a transformation is first applied to the original syndrome, which yields a result identical to the case for the non-systematic form of the matrix. This transformation is easily accomplished by multiplying the raw 16-bit syndrome vector by the square check bit matrix shown in Table 3 below.

TABLE 3

15-----------------------0
0000100000100000 15
0000010000010000 |
1000001000001000 |
0100000100000100 |
0010000010000010 |
0001000001000001 |
0000001000000000 |
1000000100000000 |
0100000010000000 |
0010000001000000 |
1001000000100000 |
0100100000010000 |
0010010000001000 |
0001000000000100 |
0000100000000010 |
0000010000000001 0

For example, if we assume that bits at indices 1,018 & 999 (19-bits apart) are in error, the syndrome returned by the systematic matrix is:

$$0\ 0\ 1\ 0\ 1\ 1\ 1\ 0\ 1\ 0\ 1\ 0\ 0\ 0\ 0\ 0$$

After transformation using the square matrix of Table 3 the syndrome becomes: 0 1 1 0 0 0 1 0 1 1 1 1 0 0 1 1, which is indeed the syndrome that would be returned by the non-systematic matrix above for the original data stream.

The first (left-most) 6 bits are the sub-syndrome of the BIP generated component and are indicative of a 2-bit error 19 bits apart as indicated in the BIP-6 syndrome pattern of Table 2.

An alternate method is to use the systematic form matrix for generation and the original (non-systematic) matrix for checking. This approach, however, has the drawback that two large XOR arrays are needed—one for ECC checkbit generation and one for checking and correction. A brute-force way of decoding the syndromes consists of storing the 3,976 combinations of bits to be corrected in a $2^{16}$ (i.e.: 65,536) entry lookup table (e.g.: a ROM). All other entries, if addressed, have to be considered as detected but uncorrectable errors (UE) that do not match the error model (i.e.: errors resulting from a single bit transmission error and spaced as the power of the scrambler) and cannot be corrected.

Figure 9:
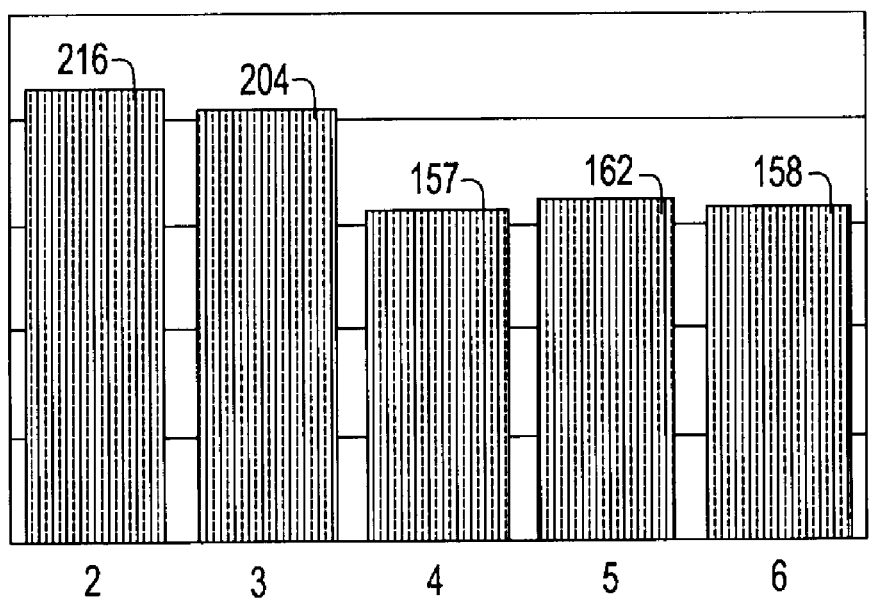
FIG. 9 illustrates a plot of the distribution of undetected errors using the forward error correction encoding method according to the first embodiment.

Many of the transmission errors that fail to correspond to the error model can nevertheless be detected because, as discussed above, only 3,976 syndromes are used for error correction out of $2^{16}-1=65,535$ possible error syndromes indicated by a 16-bit syndrome. Such errors can be the result of more than a single error occurring in the same packet on the serial links. Thus, for example, up to 6 errors, after scrambling, could be present in a single packet as a result of a double transmission error. FIG. 9 shows the statistical distribution of a Monte-Carlo simulation plotting the results found for between 2 to 6 errors not matching the error model—approximately 91% of which are detected. However, the remaining 9% (897 out of 10,000) yield a syndrome belonging to the 3.976 combinations resulting from a double transmission error that is not detected and will therefore trigger miscorrections.

A generalization of this type of code is easily achievable from the example used to illustrate the method. Longer or shorter codes can be built by choosing other polynomials to accommodate alternative scrambling conventions. Different powers, n for BIP-n may be selected to accommodate changes in error spacing incident to the scrambling polynomial resulting in different error syndromes.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method of generating a forward error correction (FEC) code for a packet-based digital communications system performed on a serializer/deserializer (SER/DES) link using a self-synchronized scrambler and descrambler, the method comprising:
   applying a first encoding algorithm to a first dataword;
   applying a second encoding algorithm to the first dataword;
   generating a first checkbit sequence for the first dataword;
   appending the checkbit sequence to the first dataword;
   scrambling the first dataword at a source node;
   transmitting the first dataword on a data transmission link from the source node to a destination node;
   descrambling the transmitted first dataword at the destination node;
   generating a second checkbit sequence based on the transmitted dataword;
   comparing the first checkbit sequence with the second checkbit sequence;
   determining whether the received dataword contains a first bit error; and
   correcting the first bit error and a first and second replicated bit error.

2. The method according to claim 1, further comprising representing a plurality of encoded datawords in a first matrix, wherein a plurality of checkbit sequences corresponding to each of the plurality of datawords is appended to the first matrix.

3. The method according to claim 1 further comprising appending a checkbit sequence to each of a corresponding plurality of encoded datawords.

4. The method according to claim 3, further comprising generating an H-matrix in systematic form for encoding the checkbit sequence and an error syndrome, wherein the use of the same H-matrix in non-systematic form enables the decoding of the error syndrome.

5. The method according to claim 1, further comprising concatenating a plurality of datawords and providing a single checkbit sequence for error correction.

6. The method according to claim 1, wherein the data transmission link comprises a multiple link communications channel capable of inverse multiplexing.

7. The method according to claim 1, wherein the scrambling step further comprises employing a 64B/66B scrambling protocol.

8. The method according to claim 1, wherein the first encoding algorithm comprises a multiplication operation with the first dataword and a Hamming code polynomial as primary arguments.

9. The method according to claim 8, wherein the Hamming code determines the maximum length of the packet size, including error correction and parity bits.

10. The method according to claim 8, wherein the Hamming code is generated from a tenth order irreducible polynomial of the form: $H(x)=x^{10}+x^3+1$.

11. The method according to claim 1, wherein the second encoding algorithm comprises a multiplication operation with the first dataword and a bit-interleaved parity code of degree n as primary arguments, where n corresponds to the highest order of the polynomial representing the bit-interleaved parity code.

12. The method according to claim 11, wherein the BIP code comprises a sixth order polynomial of the form: $B(x)=x^6+1$.

13. The method according to claim 1, wherein the digital communications system transmits and receives a packetized data stream in an ATM format.

14. The method according to claim 1, wherein the data transmission link comprises a single serializer-deserializer link.

15. A method of applying a forward error correction code to a digital signal for transmission on a serializer-deserializer link using a self-synchronized scrambler and descrambler, the method comprising:
   applying a Hamming code to the digital signal from an irreducible polynomial of the form $H(x)=x^{10}+x^3+1$;
   applying a bit-interleaved parity code to the digital signal of degree n (BIP-n), where n corresponds to the highest order of the polynomial representing the bit-interleaved parity code;
   generating a first checkbit sequence for the encoded digital signal;
   appending the first checkbit sequence to the encoded digital signal;
   scrambling the encoded digital signal and the first checkbit sequence using a 64B/66B scrambling protocol;
   transmitting the scrambled and encoded digital signal over the serializer-deserializer link;
   descrambling the transmitted digital signal at a receiver node;
   generating a second checkbit sequence at the receiver node;
   comparing the first checkbit sequence with the second checkbit sequence;
   determining whether the transmitted digital signal contains a first bit error; and
   correcting the first bit error, a first replicated error and a second replicated error.

16. The method according to claim 15, wherein the BIP code comprises a sixth order polynomial of the form: $B(x)=x^6+1$.

17. A method of building a forward error correction (FEC) code for a packet-based digital communications system using a self-synchronized scrambler, said method comprising the steps of:

determining the power (n) of a bit interleave parity (BIP-n) code capable of discriminating between all error patterns of a single transmission error and replications thereof generated by said self-synchronized scrambler upon reception of transmitted FEC encoded frames), where n corresponds to the highest order of the polynomial representing the bit-interleaved parity code;

determining the power of a polynomial used to generate a Hamming code of a length compatible with the packet size of said packet-based digital communications system;

combining said BIP-n code and said Hamming code to form said FEC code and obtain, upon reception of said transmitted FEC encoded frames, a set of unique syndromes for all combinations of said single bit transmission errors and replications; and allowing the FEC code to correct all single transmission errors and their replications by the self-synchronized scrambler while preserving a bit transition density of a physical layer as provided by said scrambler.

18. The method of claim 17 wherein power (n) of said BIP-n code is such that all powers of the polynomial defining said self-synchronized scrambler have a unique residue modulo n, where n corresponds to the highest order of the polynomial representing the bit-interleaved parity code.

19. The method of claim 17 wherein the power of said Hamming polynomial is such that the FEC code length is greater than or equal to the packet size of said digital communications system.

20. A program storage device readable by a processor, tangibly embodying a program of instructions executable by the processor to perform method steps for generating a forward error correction (FEC) code in a packet-based digital communications system using a self-synchronized scrambler and descrambler, said method steps comprising:

applying a first encoding algorithm to a first dataword;
applying a second encoding algorithm to the first dataword;
generating a first checkbit sequence for the first dataword;
appending the checkbit sequence to the first dataword;
scrambling the first dataword at a source node;
transmitting the first dataword on a data transmission link from the source node to a destination node;
descrambling the transmitted first dataword at the destination node; and
generating a second checkbit sequence based on the transmitted dataword;
comparing the first checkbit sequence with the second checkbit sequence;
determining whether the received dataword contains a first bit error; and
correcting the first bit error and correcting a first and second replicated bit error.

21. The program storage device of claim 20, wherein generating the first checkbit sequence for the first dataword comprises the logical XOR of a plurality of bits forming the first dataword.

22. The program storage device of claim 20, wherein the comparing step produces a first error syndrome representing the number of errors contained in the received dataword.

23. The program storage device of claim 20, wherein the comparing step produces a second error syndrome representing the location of a first error and a first or second replicated error spaced according to the powers of a scrambling polynomial.

24. The program storage device of claim 20, further comprising detecting a second bit error.

25. The program storage device according to claim 20, wherein the program of instructions further comprises transposing an error syndrome vector to a systematic H-matrix form.

26. The program storage device according to claim 20, wherein the first encoding algorithm comprises a multiplication operation with the packetized dataword and a Hamming code polynomial as primary arguments.

27. The program storage device according to claim 26, wherein the Hamming code determines the maximum length of the packet size, including error correction and parity bits.

28. The program storage device according to claim 26, wherein the Hamming code is generated from a tenth order irreducible polynomial of the form: $H(x)=x^{10}+x^3+1$.

29. The program storage device according to claim 20, wherein the second encoding algorithm comprises a multiplication operation with the first dataword and a bit-interleaved parity code of degree n as primary arguments.

30. The program storage device according to claim 20, wherein the BIP code comprises a sixth order polynomial of the form: $B(x)=x^6+1$.

31. A system for generating a forward error correction (FEC) code for a packetized dataword, the system comprising:

a first encoder adapted to apply a first encoding algorithm to the packetized dataword;
a second encoder adapted to apply a second encoding algorithm to the packetized dataword;
a scrambler element adapted to apply a scrambling polynomial to the encoded packetized dataword at a source node;
a communications channel link adapted to transmit the encoded and scrambled packetized dataword from the source node to a destination node;
a descrambler element adapted to apply a descrambling polynomial to the transmitted packetized dataword at the destination node;
a decoder element adapted to decode the encoded packetized dataword at a destination node; and
an XOR logic element adapted to compare a regenerated checkbit sequence with a transmitted checkbit sequence appended to the transmitted packetized dataword.

32. The system according to claim 31, wherein the scrambling element employs a 64B/66B scrambling protocol.

33. The system according to claim 31, wherein the descrambling function comprises an inverse mathematical operation of the scrambling polynomial.

34. The system according to claim 31, wherein the first encoding algorithm comprises a multiplication operation with the packetized dataword and a Hamming code polynomial as primary arguments.

35. The system according to claim 34, wherein the Hamming code determines the maximum length of the packet size, including error correction and parity bits.

36. The system according to claim 34, wherein the Hamming code is generated from a tenth order irreducible polynomial of the form: $H(x)=x^{10}+x^3+1$.

37. The system according to claim 31, wherein the second encoding algorithm comprises a multiplication operation with the first dataword and a bit-interleaved parity code of degree n as primary arguments.

38. The system according to claim 37, wherein the BIP (bit-interleaved parity) code comprises a sixth order polynomial of the form: $B(x)=x^6+1$.

* * * * *